United States Patent [19]
Ilkbahar et al.

[11] Patent Number: 5,898,321
[45] Date of Patent: Apr. 27, 1999

[54] METHOD AND APPARATUS FOR SLEW RATE AND IMPEDANCE COMPENSATING BUFFER CIRCUITS

[75] Inventors: Alper Ilkbahar, Santa Cruz; Bendik Kleveland, Palo Alto, both of Calif.

[73] Assignee: Intel Corporation, Santa Clara, Calif.

[21] Appl. No.: 08/824,066

[22] Filed: Mar. 24, 1997

[51] Int. Cl.$^6$ ............................................. H03K 19/0185
[52] U.S. Cl. ........................ 326/87; 326/83; 326/30; 327/170
[58] Field of Search .......................... 326/24, 27, 83, 326/86, 87, 121, 30; 327/170

[56] References Cited

U.S. PATENT DOCUMENTS

| 4,719,369 | 1/1988 | Asono et al. | 326/87 |
| 4,975,598 | 12/1990 | Borkar | 307/443 |
| 5,013,940 | 5/1991 | Ansel | 326/27 |
| 5,063,308 | 11/1991 | Borkar | 307/443 |
| 5,216,289 | 6/1993 | Hahn et al. | 326/27 |
| 5,231,311 | 7/1993 | Ferry et al. | 326/87 |
| 5,528,166 | 6/1996 | Ikbahar | 326/27 |
| 5,568,081 | 10/1996 | Lui et al. | 326/27 |
| 5,594,371 | 1/1997 | Douseki | 326/83 |
| 5,602,494 | 2/1997 | Sundstrom | 326/39 |

FOREIGN PATENT DOCUMENTS

| 5-206829 | 8/1993 | Japan | 326/87 |

OTHER PUBLICATIONS

Donnelly KS et al.: A 660 MB/s Interface Megacell Portable Circuit in 0.3 μm CMOS ASIC, IEEE J of Solid-State Circuits, vol. 31 (12): Dec. 1996.

Gabara TJ et al.: Forming Damped LRC Parasitic Circuits in Simultaneously Switched CMOS Output Buffers, IEEE J of Solid-State Circuits, vol. 32(3), Mar. 1997.

Primary Examiner—Jon Santamauro
Assistant Examiner—Don Phu Le
Attorney, Agent, or Firm—Blakely, Sokoloff, Taylor & Zafman LLP

[57] ABSTRACT

A method and an apparatus for adjusting the slew rate and impedance of a buffer in an integrated circuitry. In one embodiment, an integrated circuit buffer includes a pre-driver circuit, which includes a slew rate compensation circuit, coupled to a driver circuit, which includes an impedance compensation circuit. The slew rate compensation circuit includes parallel connected p-channel transistors to power and parallel connected n-channel transistors to ground to provide a variable resistance to virtual rails for inverter circuits that are included in the pre-driver circuit. The slew rate compensation circuit is digitally controlled with slew rate control signals. The impedance compensation circuit includes parallel connected p-channel transistors to power and parallel connected n-channel transistors to ground from an output node of the buffer. The parallel connected transistors of the impedance compensation circuit are digitally controlled with impedance control signals. The resistance to power and ground from the respective rails of the pre-driver circuit are controlled with the slew rate control signals to adjust the slew rate of data signals being driven by the buffer. The rails are shared among the inverters of the driver circuit to reduce the number of devices used by the buffer, thereby reducing the amount of circuit area and power used by the buffer.

15 Claims, 5 Drawing Sheets

1

METHOD AND APPARATUS FOR SLEW RATE AND IMPEDANCE COMPENSATING BUFFER CIRCUITS

RELATED APPLICATION

This application is related to co-pending application Ser. No. 08/823,215, filed Mar. 24, 1997, entitled "Method and Apparatus for Testing Compensated Buffer Circuits," and assigned to the Assignee of the present application.

This application is also related to co-pending application Ser. No. 08/823,220, filed Mar. 24, 1997, entitled "Method and Apparatus for Controlling Compensated Buffers," and assigned to the Assignee of the present application.

BACKGROUND OF THE INVENTION

1. Field of the Invention

The present invention relates generally to integrated circuit technology and, more specifically, the present invention relates to integrated circuit buffers.

2. Description of the Related Art

To achieve high performances in modern integrated circuits, it is often necessary to utilize high speed buffer circuits, such as for example input/output buffers. One common use for input/output buffers is to interface integrated circuits with buses. Input/output buffers that are coupled to buses are often required to drive external loads that are large in comparison with the internal loads other integrated circuits drive.

As integrated circuit technologies continue to advance, the frequencies at which the integrated circuits operate increase accordingly. It has been a considerable challenge for circuit designers to design buses that are able to match the speed performance of the core speed of modern CPUs. One reason for the difficulty of continuously increasing bus speeds to match the continuously increasing CPU core speeds is that input/output buffers connected to the buses must often operate across a wide variety of operating conditions. For instance, the performance of a buffer changes significantly over process, voltage and temperature variations. As these conditions change, the noise and response characteristics of the input/output buffers connected to the buses are effected. For stable operation, integrated circuit designers must often limit the speed at which the buffer circuits such as input/output buffers operate to accommodate the potential variations in conditions.

The utilization of impedance compensated input/output buffers is one prior art solution that integrated circuit designers have used to accommodate variations in conditions. Impedance compensated input/output buffers provide a mechanism to maintain the optimum characteristics of an input/output buffer over a wide range of operating conditions. Impedance compensation enables the output impedance of the input/output buffer to be varied in order to match the line impedance of a line connected to the input/output buffer. As a result, the output impedance of the integrated circuit buffers can be adjusted accordingly to reduce noise and thereby increase performance as process, voltage and temperature conditions change.

The slew rate of a buffer circuit is another characteristic that is effected by variations in conditions such as process, voltage and temperature. As externally terminated buses become more commonly implemented in integrated circuit systems, the slew rate characteristic of a buffer becomes an increasingly significant factor in high speed applications. Indeed, variations in process, voltage and temperature may cause corresponding variations in the slew rate as well as variations in the impedance of buffers.

It is appreciated that the significance of the impedance and slew rate of buffer circuits is relevant to a variety of integrated circuit applications and is therefore not limited only to input/output buffers. For example, power supply ringing or the simultaneous switching noise observed in power supplies in integrated circuits may also be attributed to slew rate variations of a buffer circuit as a consequence of changes in conditions.

What is desired is a method and an apparatus for adjusting both the slew rate and the impedance of buffer circuits in order to compensate for variations in conditions such as process, voltage and temperature in integrated circuits. Such a method and apparatus should be readily implemented in integrated circuits with minimal area to maximize the performance of buffer circuits over a variety operating conditions.

SUMMARY OF THE INVENTION

A method and an apparatus for impedance and slew rate compensating a compensated buffer circuit is described. In one embodiment, a compensated buffer circuit includes a pre-driver circuit that includes a slew rate compensation circuit. The pre-driver circuit is coupled to receive a data signal and the slew rate compensation circuit is coupled to receive a slew rate control signal to control a variable resistance of the slew rate compensation circuit. The described compensated buffer circuit also includes a driver circuit that includes an impedance compensation circuit. The driver circuit is coupled to the pre-driver circuit to receive the data signal and the impedance compensation circuit is coupled to receive an impedance control signal. The driver circuit is coupled to output the data signal at an output node. Additional features and benefits of the present invention will become apparent from the detailed description, figures and claims set forth below.

BRIEF DESCRIPTION OF THE DRAWINGS

The present invention is illustrated by way of example and not limitation in the accompanying figures.

DETAILED DESCRIPTION

A method and an apparatus for adjusting the slew rate and impedance of buffer circuit to compensate for variations in conditions such as process, voltage and temperature is disclosed. In the following description, numerous specific details are set forth in order to provide a thorough understanding of the present invention. It will be apparent, however, to one having ordinary skill in the art that the specific detail need not be employed to practice the present invention. In other instances, well known materials or methods have not been described in detail in order to avoid obscuring the present invention.

As discussed, impedance matching and slew rate control are important features in high speed and high performance buffers. Due to variations in conditions such as process, voltage and temperature, the impedances and slew rates of buffers may vary considerably thereby degrading the speed and performance of uncompensated buffers. The present invention provides a combined slew rate and impedance compensated buffer that is configured to receive slew rate and impedance control signals to allow adjustments of slew rate and impedance to match the slew rate requirements and impedance of external buses/lines that are connected to the buffer in varying on-chip as well as off-chip conditions, such as for example, different packages, circuit boards, etc.

Figure 1:
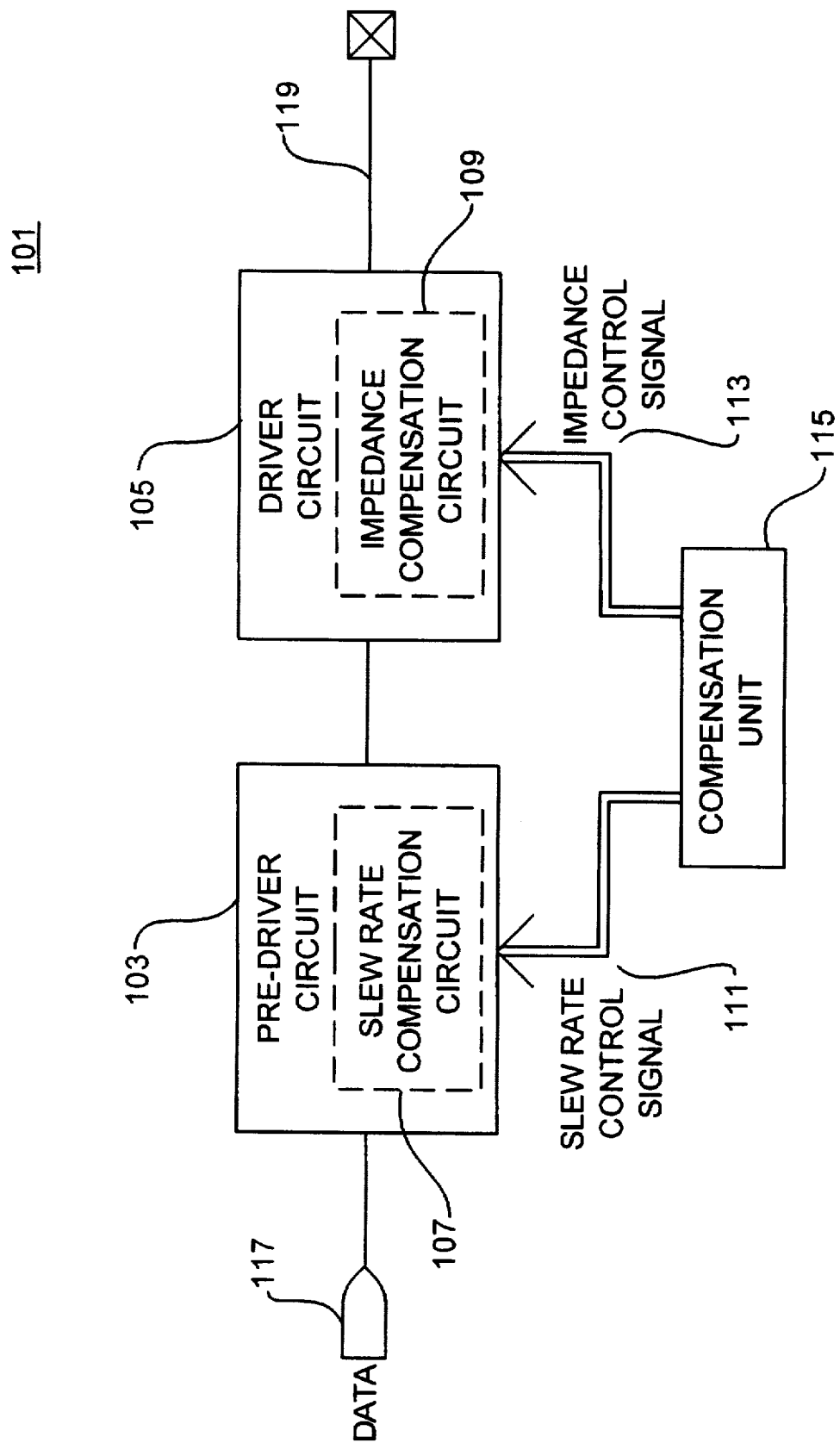
FIG. 1 is a block diagram of a slew rate and impedance compensated input/output buffer in accordance with the teachings of the present invention.

FIG. 1 is a block diagram of a compensated buffer circuit 101 in accordance with the teachings of the present invention. As shown in FIG. 1, buffer circuit 101 includes pre-driver circuit 103 coupled to receive a data signal 117. Driver circuit 105 is coupled to receive the data from pre-driver circuit 103 and to output the data at pin 119.

Included in pre-driver circuit 103 is slew rate compensation circuit 107. As shown in FIG. 1, a slew rate control signal 111 is received by the slew rate compensation circuit 107 to control the slew rate of the data output at pin 119. As also shown in FIG. 1, driver circuit 105 includes impedance compensation circuit 109. Impedance control signal 113 is received by impedance compensation circuit 109 to control the output impedance of the data output at pin 119.

In one embodiment of the present invention, compensated buffer circuit 101 is utilized in the output portion of an input/output buffer coupled to a bus (not shown). Slew rate control signal 111 and impedance control signal 113 are generated by a compensation unit 115 as shown in FIG. 1. Compensation unit 115 generates slew rate control signal 111 and impedance control signal 113 using well known techniques to compensate for variations in process, voltage and temperature to adjust the slew rate and impedance of buffer 101 accordingly. In another embodiment, slew rate control signal 111 and impedance control signal 113 each include a plurality of digital signals generated by compensation unit 115 using well known techniques. In yet another embodiment, impedance compensation circuit 109 is coupled to receive impedance control signal 113 through pre-driver circuit 103.

Figure 2:
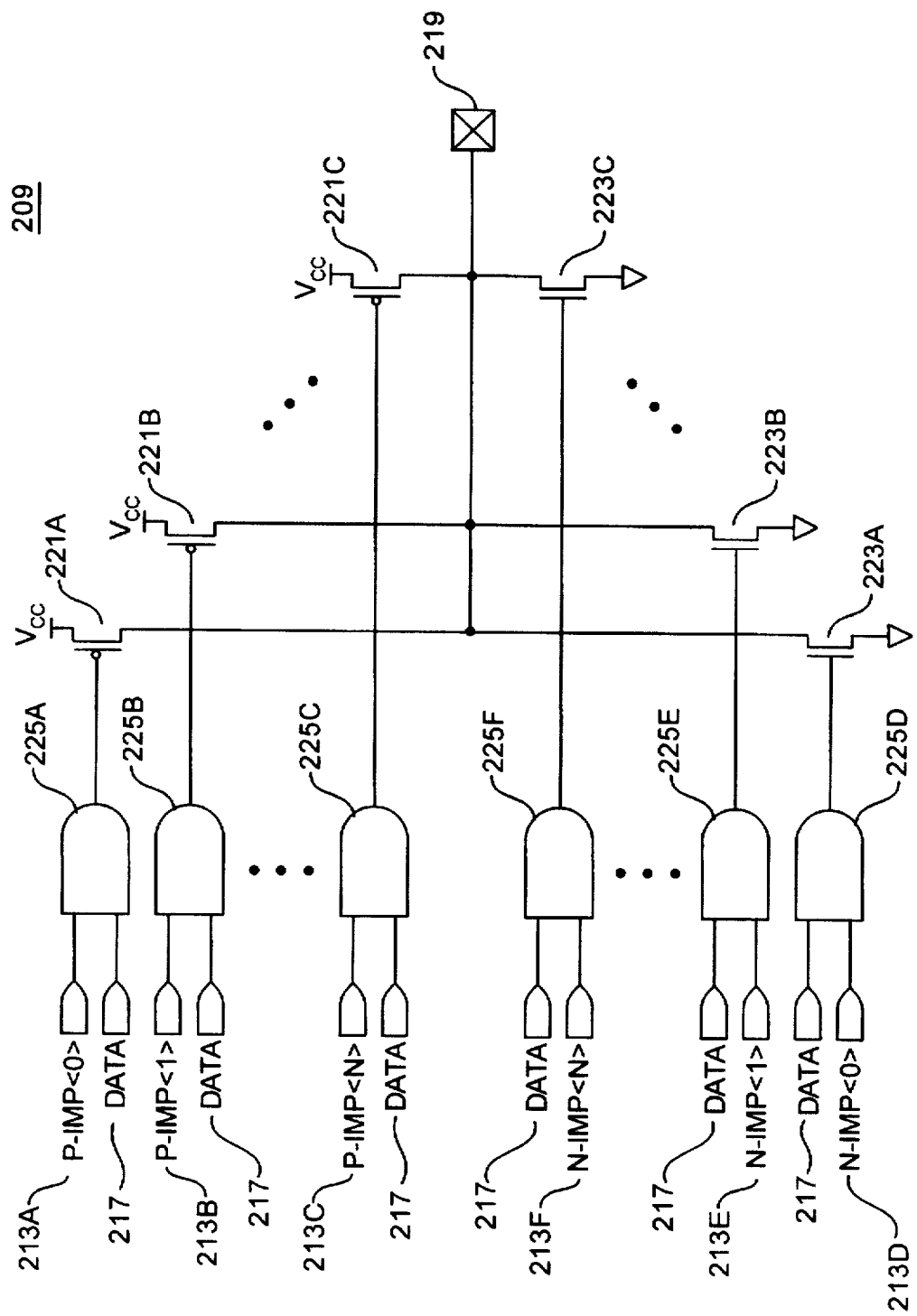
FIG. 2 is a simplified schematic of one embodiment of an impedance compensation circuit in accordance with the teachings of the present invention.

FIG. 2 is an illustration of a simplified schematic of one embodiment of impedance compensation circuit 209, which may be used in place of impedance compensation circuit 109 of FIG. 1 in accordance with the teachings of the present invention. As shown in FIG. 2, impedance compensation circuit 209 includes a plurality of n-channel transistors 223A-C coupled in parallel between pin 219 and ground. Similarly, impedance compensation circuit 209 also includes p-channel transistors 221A-C coupled in parallel between pin 219 and Vcc. Impedance control signals for the p-channel transistors 221A-C are received as P-IMP signals 213A-C, labeled as P-IMP<0> through P-IMP<N>. Similarly, impedance control signals for the n-channel transistors 223A-C are received as N-IMP signals 213D-F, labeled as N-IMP<0> through N-IMP<N>. Using well known techniques, data 217 is received by p-channel transistors 221A-C and n-channel transistors 223A-C based on the settings of the impedance control signals 223A-F. In one embodiment, logical-AND gates 225A-F are coupled to a corresponding p-channel transistor 221A-C or n-channel transistor 223A-C to determine whether data 217 is received at the gate of the corresponding p-channel transistor 221A-C or n-channel transistor 223A-C.

In operation, if the impedance to ground from pin 219 needs to be decreased, more n-channel transistors 223A-C may be switched on with impedance control signals 213D-F. Conversely, if the impedance to ground from pin 219 needs to be increased, then more n-channel transistors 223A-C may be switched off with impedance control signals 213D-F. Similarly, if the impedance from pin 219 to Vcc needs to be decreased, then more p-channel transistors 221A-C may be switched on using impedance control signals 213A-C. Conversely, if the impedance from pin 219 needs to be increased, then more p-channel transistors 221A-C may be switched off using impedance control signals 213A-C. Based on the settings of the impedance control signals 213A-F, the output impedance of impedance compensation circuit 209 may be adjusted accordingly. As a result, the output impedance of driver circuit 105 may be adjusted to match the line impedance of a bus connected to pin 219.

It is appreciated that driver circuit 105 with impedance compensation circuit 209 of the present invention forms a source terminated driver, or push-pull driver, coupled to the bus through pin 219. With the presently described invention, driver 105 with impedance compensation circuit 209 features the characteristic of the source impedance of driver 105 having the ability to be matched with the line impedance of the bus coupled to pin 219.

In one embodiment, the resistance of the p-channel transistors 221A-C and n-channel transistors 223A-C are not equal. In particular, the resistance the p-channel transistors 221A-C may be binary-weighted and the n-channel transistors 223A-C may be binary-weighted to a different weight to provide wide range of control in the resistance from pin 219 to Vcc or to ground using well known techniques.

In another embodiment, one or more of the p-channel transistors 221A-C and n-channel transistors 223A-C may be configured to always be enabled. This embodiment provides increased resolution in the range of resistances that may be provided between pin 219 and Vcc or between pin 219 and ground. One or more of the p-channel transistors 221A-C and n-channel transistors 223A-C may be constantly enabled by ensuring that the corresponding P-IMP or N-IMP signal is always active using well known techniques when impedance compensation circuit 209 is utilized.

Figure 3:
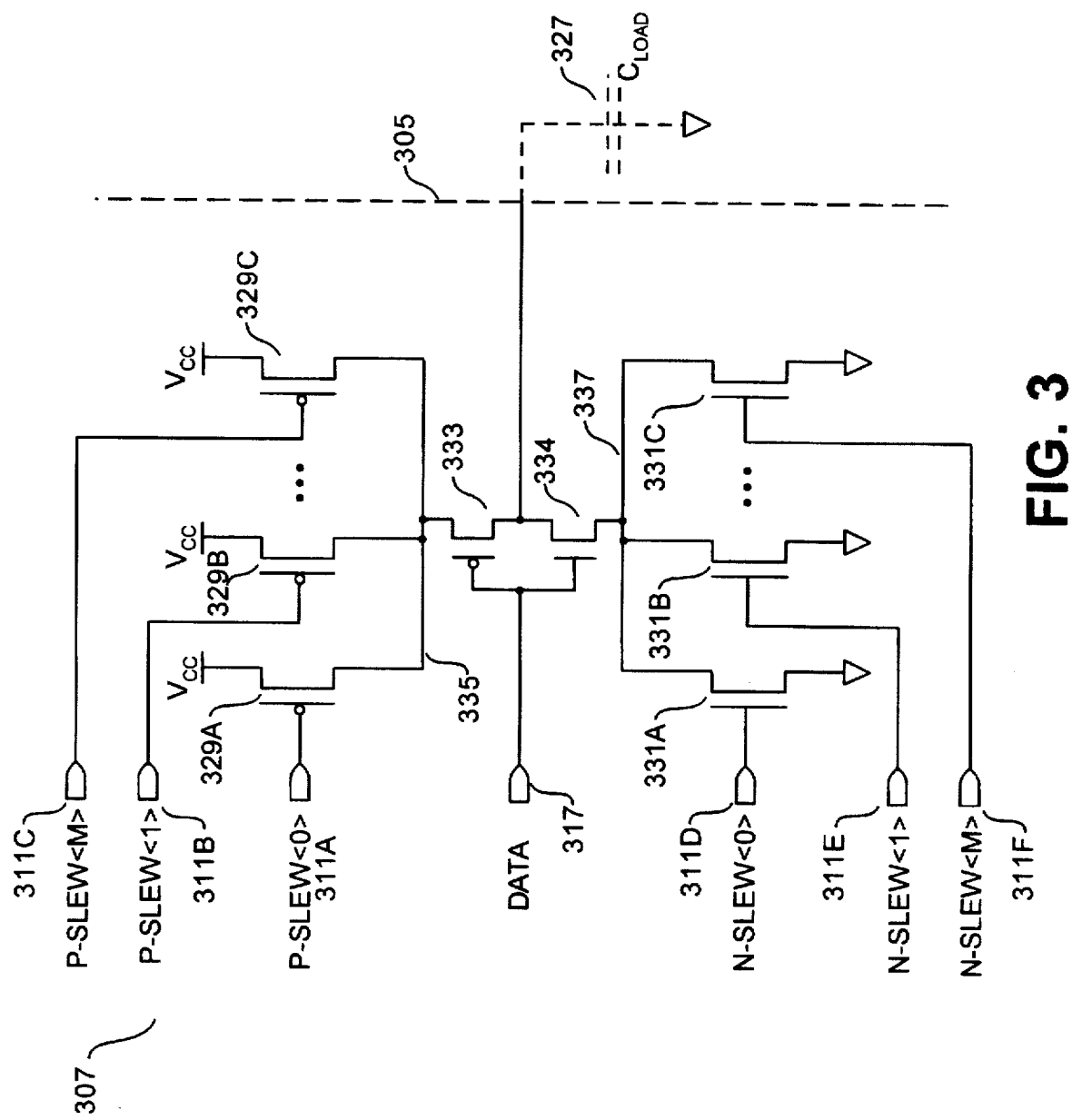
FIG. 3 is a simplified schematic and block diagram of one embodiment of a slew rate compensation circuit in accordance with the teachings of the present invention.

FIG. 3 is a simplified schematic of one embodiment of slew rate compensation circuit 307 that may be included in pre-driver circuit 103 in accordance with the teachings of the present invention. As shown in FIG. 3, slew rate compensation circuit 307 is shown to the left of dashed line 305. Slew rate compensation circuit 307 drives a load, which includes driver circuit 105 (not shown), having an effective load capacitance shown as $C_{LOAD}$ 327. It is appreciated that $C_{LOAD}$ 327 has a tendency to remain relatively fixed over changes in conditions such as process, voltage and temperature since capacitance has a relatively small variation over process, voltage and temperature.

In one embodiment of the present invention, slew rate compensation circuit includes an inverter, which includes p-channel transistor 333 and n-channel transistor 334, coupled between rails 335 and 337. In the embodiment shown, rail 335 is configured to be a virtual Vcc and rail 337 is configured to be a virtual ground. The gates of p-channel transistor 333 and n-channel transistor 334 are coupled to receive data 317 and output a signal which drives $C_{LOAD}$ 327.

As shown in FIG. 3, slew rate compensation circuit 307 includes a plurality of p-channel transistors 329A–C coupled in parallel between Vcc and rail 335. The slew rate control signal P-SLEW, shown as P-SLEW<0> through P-SLEW<M> signals 311A–C are coupled to the gates of each p-channel transistor 329A–C. It is appreciated that p-channel transistors 329A–C provide a variable resistance between rail 335 and Vcc in response to P-SLEW<M> signals 311A–C.

Slew rate compensation circuit 307 also includes a plurality of n-channel transistors 331A–C coupled in parallel between rail 337 and ground. The portion of the slew rate control signal N-SLEW, shown as N-SLEW<0> through N-SLEW<M> signals 311D–F, is coupled to the gate of each n-channel transistor 331A–C. It is appreciated that n-channel transistors 331A–C provide a variable resistance between rail 337 and ground in response to N-SLEW<M> signals 311D–F.

In one embodiment of the present invention, slew rate control signals P-SLEW and N-SLEW each include a plurality of digital signals, where each digital signal controls the gate of a corresponding p-channel or n-channel transistor. In operation, if it is desired to decrease the resistance from rail 335 to Vcc, then more p-channel transistors 329A–C can be switched on with P-SLEW signals 311A–C. If the resistance from rail 335 to Vcc is desired to be increased, then more p-channel transistors 329A–C can be switched off with P-SLEW signals 311A–C. Similarly, if the resistance from rail 337 is desired to be decreased, then more n-channel transistors 331A–C can be switched on with N-SLEW signals 311D–F. If the resistance from rail 337 is desired to be increased, then more n-channel transistors 331A–C can be switched off using N-SLEW signals 311D–F.

As the number of p-channel transistors 329A–C and n-channel transistors 331A–C that are switched on or off varies, the resistance to power and/or ground from $C_{LOAD}$ 327 is varied accordingly. As a result, the resistor-capacitor (RC) time constant can be adjusted to determine the rise and fall times of any signals output by inverter 333. Thus, it is appreciated that the slew rate of the presently described buffer can also be adjusted accordingly to compensate for variations in conditions, such as process, voltage and temperature.

In one embodiment, the resistance associated with p-channel transistor 333 is relatively small in comparison with the resistances of p-channel transistors 329A–C. Similarly, the resistance associated with n-channel transistor 334 is relatively small in comparison with the resistances of n-channel transistors 331A–C. As a result, the changes in conditions such as process, voltage and temperature that result in a change in resistance of p-channel transistor 333 or n-channel transistor 334 will be relatively inconsequential in comparison with the combined overall resistances to Vcc or ground from $C_{LOAD}$ 327 through p-channel transistors 329A–C and n-channel transistors 331A–C respectively. Furthermore, this change in resistance itself may be compensated for with the presently described scheme.

Figure 4:
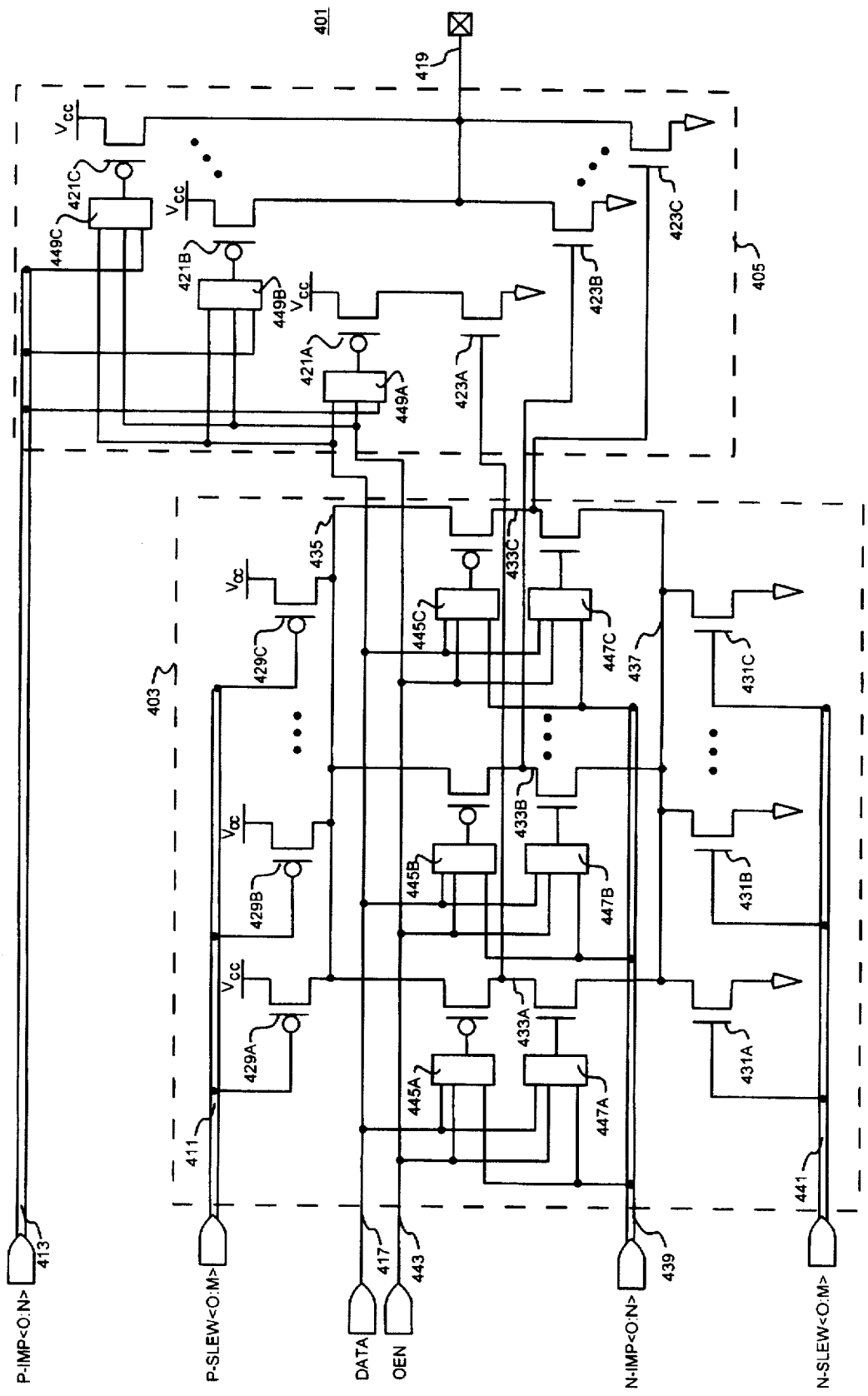
FIG. 4 is a schematic of one embodiment of a slew rate and impedance compensated buffer in accordance with the teachings of the present invention.

FIG. 4 is a schematic of one embodiment of a slew rate and impedance compensated buffer 401 in accordance with the teachings of the present invention. In one embodiment, buffer 401 is used in the output portion of an input/output buffer coupled to an externally terminated bus (not shown). As shown in FIG. 4, buffer 401 includes pre-driver circuit 403 and driver circuit 405. In the embodiment shown, pre-driver circuit 403 includes a plurality of inverters 433A–C coupled between rails 435 and 437. Similar to the embodiment discussed with respect to FIG. 3, rail 435 is configured to act as a virtual power and rail 437 is configured to act as a virtual ground. Thus, it is appreciated that rails 435 and 437 are shared among the plurality of inverters 433A–C. Since rails 435 and 437 are shared by inverters 433A–C, the overall number of devices required in buffer 401 is reduced which thereby reduces the amount of area and power required to implement buffer 401.

Slew rate compensation circuit is implemented in buffer 401 with the plurality of p-channel transistors 429A–C coupled in parallel between rail 435 and Vcc as well as the plurality of n-channel transistors 431A–C coupled in parallel between rail 437 and ground. The plurality of p-channel transistors 429A–C is controlled with P-SLEW<0:M> 411 and the plurality of n-channel transistors 431A–C is controlled with N-SLEW<0:M> 441.

In the embodiment shown in FIG. 4, an output enable signal, shown as OEN 443, is received by input/buffer 401. OEN 443 indicates when data 417 is valid. Data 417 is sampled when OEN 443 is enabled and data 417 is ignored when OEN 443 is disabled. In the embodiment shown in FIG. 4, data 417 and OEN 443 are each received by the plurality of inverters 433A–C.

In addition, a corresponding N-IMP<0:N> 439 signal is also received by each one of the corresponding plurality of inverters 433A–C as shown in FIG. 4. Using well known techniques, data 417, OEN 443 and a corresponding N-IMP<0:N> 439 signal is received by each of the p-channel transistors of the plurality of inverters 433A–C through logic 445A–C such that data 417 is received only when OEN 443 and the corresponding N-IMP<0:N> 439 signals are enabled. Similarly, the n-channel transistors of the plurality of inverters 433A–C receive data 417 through logic 447A–C using well known techniques only when OEN 443 as well as a corresponding N-IMP<0:N> 439 signal are enabled.

As shown in FIG. 4, each one of the plurality of inverters 433A–C has an output coupled to a corresponding one of the plurality of n-channel transistors 423A–C of the impedance compensation circuit of driver circuit 405. As discussed with respect to FIG. 2, the impedance compensation circuit of driver circuit 405 includes a plurality of n-channel transistors 423A–C coupled in parallel between pin 419 and ground. The impedance compensation circuit also includes a plurality of p-channel transistors 421A–C coupled in parallel between pin 419 and Vcc.

As shown in FIG. 4, each one of the plurality of p-channel transistors 421A–C are coupled to receive data 417, OEN 443 and one of the corresponding P-IMP<0:N> 413 signals using well known techniques through logic 449A–C. Thus, data 417 is received by each one of a plurality of p-channel transistors 421A–C when OEN 443 and one of the corresponding P-IMP<0:N> 413 signals are enabled.

In another embodiment of the present invention, it is noted that the same compensation control signals that control p-channel transistors 429A–C may be used to control p-channel transistors 421A–C while the compensation signals that control n-channel transistors 431A–C may be used to control n-channel transistors 423A–C. In yet another embodiment, the same compensation control signals that control p-channel transistors 429A–C may be used to control n-channel transistors 431A–C while the compensation signals that control p-channel transistors 421A–C may be used to control n-channel transistors 423A–C. By using the same compensation control signals to control various transistors as described, both circuit area and power are saved.

It is also noted that one embodiment of buffer 401 shown in FIG. 4 may be configured to be coupled to an externally terminated bus coupled to pin 419. Indeed, as is well known in the art, an externally terminated bus may include a pull-up termination resistor to $V_{TERM}$ or $V_{DD}$ (not shown), which thereby reduces the need for slew rate compensation signals to be coupled to the plurality of p-channel transistors 421A–C. That is, by controlling the rise and fall times of signals pulled down to ground through the plurality of n-channel transistors 423A–C, slew rate control is realized with the presently described invention. In addition, impedance control is realized with the presently described invention through the plurality of n-channel transistors 423A–C and the plurality of p-channel transistors 421A–C.

Figure 5:
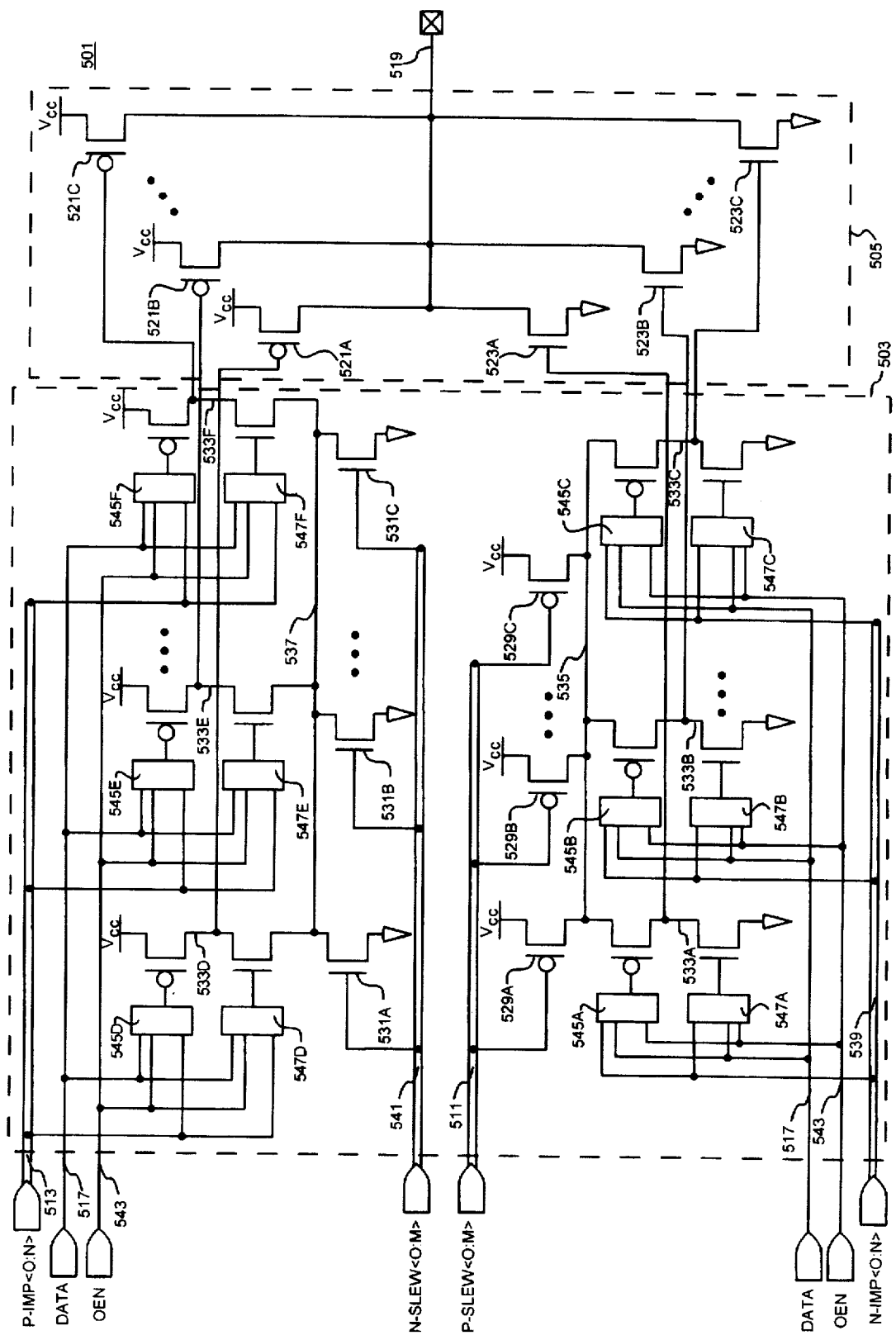
FIG. 5 is a schematic of another embodiment of a slew rate and impedance compensated buffer in accordance with the teachings of the present invention.

FIG. 5 is a schematic of another embodiment of a slew rate and impedance compensated buffer 501. In one embodiment, buffer 501 is used in the output portion of an input/output buffer coupled to a bus (not shown) that is not externally terminated. Buffer 501 includes pre-driver circuit 503 and driver circuit 505. Similar to the buffer 401 described with respect to FIG. 4, the pre-driver circuit 503 of buffer 501 includes a plurality of inverters 533A–C, each of which are coupled to a corresponding one of the plurality of n-channel transistors 523A–C. N-channel transistors 523A–C are coupled in parallel between pin 519 and ground. Unlike buffer 401 of FIG. 4, the pre-driver circuit 503 of FIG. 5 includes another plurality of inverters 533D–F, each of which has an output coupled to a gate of a corresponding one of the plurality of p-channel transistors 521A–C. P-channel transistors 521A–C are coupled in parallel between Vcc and pin 519.

Furthermore, as shown in FIG. 5, the plurality of inverters 533A–C are coupled between rail 535 and ground. The plurality of inverters 533D–F are coupled between Vcc and rail 537. Rail 535 is configured to act as a virtual Vcc and rail 537 is configured to act as a virtual ground. The plurality of parallel coupled p-channel transistors 529A–C are configured to vary the resistance between rail 535 and Vcc while the plurality of parallel coupled n-channel transistors 531A–C are configured to vary the resistance between rail 537 and ground. As shown in FIG. 5, the plurality of p-channel transistors 529A–C are controlled with P-SLEW <0:M> 511 while the plurality of n-channel transistors 531 A–C are controlled with N-SLEW <0:M> 541.

As also shown in FIG. 5, the plurality of inverters 533D–F are coupled to receive data 517, the output enable signal, shown as OEN 543, and one of the corresponding P-IMP<0:N> signals 513 using well known techniques through logic 545D–F and 547D–F. As a result, the p-channel transistors of inverters 533D–F receive data 517 through logic 545D–F only when OEN 543 as well as one of the corresponding signals P-IMP<0:N> 513 are enabled. Similarly, the n-channel transistors of inverters 533D–F receive data 517 through logic 547D–F only when OEN 543 and one of the corresponding P-IMP<0:N> signals are enabled.

Thus, with the presently described buffer 501, the slew rate at which output signals generated at pin 519 rise from low logic levels to high logic levels are controlled by controlling the number of parallel coupled n-channel transistors 531A–C that are switched on. Conversely, the slew rate at which an output signal falls from a high logic level to a low logic level is controlled by controlling the number of parallel coupled p-channel transistors 529A–C that are switched on. The output impedance of buffer 501 from pin 519 to Vcc is controlled by controlling the number of parallel coupled p-channel transistors 521A–C are switched on and the output impedance of buffer 501 from pin 519 to ground is controlled by controlling the number of parallel coupled n-channel transistors 523A–C that are switched on. In one embodiment, p-channel transistors 521A–C and n-channel transistors 523A–C are binary-weighted. In another embodiment, p-channel transistors 521A–C and n-channel transistors 523A–C are equal weighted.

It is appreciated that both of the embodiments shown in FIGS. 4 and 5 employ rails 435, 437, 535 and 537, which are shared among a plurality of inverters in pre-driver circuits 403 and 503 respectively. As described, pre-driver circuits 403 and 503 are used to drive the gates of the parallel coupled transistors to power or ground in corresponding driver circuits 405 and 505 respectively. By sharing the rails as described, it is noted that the number of devices utilized by the presently described buffer is reduced. It is appreciated that, in another embodiment, rails 435, 437, 535 and 537 may be replicated for each inverter 433A–C or 533A–F for improved linearity. The trade-off is that additional circuit area and power will be consumed as a consequence.

Thus, what has been described is a method and apparatus for adjusting the slew rate and impedance of a buffer in an integrated circuit to compensate for variations in conditions, such as process, voltage and temperature. With the presently described compensation circuitry, integrated circuit buffers such as input/output buffers can have an output impedance that is matched with the line impedance of a line coupled to the input/output buffer over a wide range of varying on-chip as well as off-chip conditions. In addition, the presently described buffer enables the adjustment of the slew rate of the buffer over a range of conditions. Furthermore, the presently described buffer utilizes a reduced number of devices which thereby reduces the amount of circuit area and power consumed by the presently described input/output buffer.

In the foregoing detailed description, the method and apparatus of the present invention have been described with reference to specific exemplary embodiments thereof. It will, however, be evident that various modifications and changes may be made thereto without departing from the broader spirit and scope of the present invention. The present specification and figures are accordingly to be regarded as illustrative rather than restrictive.

What is claimed is:

1. A compensated buffer circuit, comprising:

a pre-driver circuit including a slew rate compensation circuit, the pre-driver circuit coupled to receive a data signal, the slew rate compensation circuit coupled to receive a slew rate control signal to control a first variable resistance of the slew rate compensation circuit to a first potential and a second variable resistance of the slew rate compensation circuit to a second potential; and a driver circuit including impedance compensation circuit, the driver circuit coupled to the pre-driver circuit to receive an output of the pre-driver circuit, the impedance compensation circuit coupled to receive an impedance control signal, the driver circuit coupled to output an output of the impedance control circuit at an output node.

2. The compensated buffer circuit described in claim 1 wherein an output impedance of the compensated buffer circuit varies in response to the impedance control signal.

3. The compensated buffer circuit described in claim 1 wherein a slew rate of the output of the pre-driver circuit varies in response to the slew rate control signal.

4. The compensated buffer circuit described in claim 1 further comprising a compensation unit, the compensation unit coupled to generate the slew rate control signal and the impedance control signal.

5. The compensated buffer circuit described in claim 1 wherein the impedance compensation circuit comprises:

a first plurality of transistors coupled in parallel between the output node and the first potential, the first plurality of transistors varying the output impedance of the compensated buffer circuit between the output node and the first potential in response to the impedance control signal; and a second plurality of transistors coupled in parallel between the output node and the second potential, the second plurality of transistors varying the output impedance of the compensated buffer circuit between the output node and the second potential in response to the output of the pre-driver circuit.

6. The compensated buffer circuit described in claim 5 wherein the pre-driver circuit comprises a first plurality of inverter circuits coupled between first and second rails, each one of the first plurality of inverter circuits coupled to receive the data signal, each one of the first plurality of inverter circuits generating an output coupled to a gate of a corresponding one of the second plurality of transistors.

7. The compensated buffer circuit described in claim 6 wherein the slew rate compensation circuit comprises:

a third plurality of transistors coupled in parallel between the first rail and the first potential; and a fourth plurality of transistors coupled in parallel between the second rail and the second potential;

wherein the third and fourth plurality of transistors are coupled to the slew rate control signal such that third and fourth plurality of transistors vary the slew rate of the output of the pre-driver circuit in response to the slew rate control signal.

8. The compensated buffer circuit described in claim 1 wherein the slew rate and impedance control signals are generated by a compensation unit.

9. The compensated buffer circuit described in claim 1 wherein the compensated buffer circuit is further coupled to receive an output enable signal, the driver circuit outputting the output of the impedance control circuit in response to the output enable signal.

10. The compensated buffer circuit described in claim 1 wherein the compensated buffer circuit is a compensated input/output buffer.

11. A method for buffering a data signal generated at an input/output node of an integrated circuit, the method comprising the steps of:

receiving the data signal with a pre-driver circuit;

varying a first variable resistance of the pre-driver circuit to a first potential and a second variable resistance of the pre-driver circuit to a second potential to vary a resistor-capacitor (RC) time constant between the pre-driver circuit and a driver circuit coupled to an output of the pre-driver circuit to control a slew rate in an output of the pre-driver circuit;

receiving the output of the pre-driver circuit with the driver circuit, the driver circuit to output an output of the driver circuit;

varying an output impedance of the driver circuit such that the output impedance of the driver circuit matches a line impedance of a line coupled to the output node.

12. The method described in claim 11 including the additional step of generating a slew rate control signal wherein the step of varying the RC time constant is performed in response to the slew rate control signal.

13. The method described in claim 11 including the additional step of generating an impedance control signal wherein the step of varying the output impedance is performed in response to the impedance control signal.

14. An input/output buffer circuit, comprising:

pre-driver means for receiving a data signal and transmitting an output of the pre-driver means;

slew rate compensation means included in the pre-driver means for controlling a slew rate of the output of the pre-driver means in response to a slew rate compensation signal controlling a first variable resistance to a first potential and a second variable resistance to a second potential of the slew rate compensation means;

driver means coupled to the pre-driver means for receiving the output of the pre-driver means and transmitting an output of the driver means; and impedance compensation means included in the driver means for controlling an output impedance of the input/output buffer circuit in response to an impedance control signal.

15. The input/output buffer circuit described in claim 14 further comprising:

means for generating the slew rate compensation signal coupled to the slew rate compensation means; and means for generating the impedance control signal coupled to the impedance compensation means.

\* \* \* \* \*